United States Patent
Bae

(10) Patent No.: US 8,986,909 B2
(45) Date of Patent: Mar. 24, 2015

(54) IMPRINTING DEVICE, METHOD OF FABRICATING THE SAME, AND METHOD OF PATTERNING THIN FILM USING THE SAME

(75) Inventor: Jung-Mok Bae, Seoul (KR)

(73) Assignee: Samsung Display Co., Ltd. (KR)

( * ) Notice: Subject to any disclaimer, the term of this patent is extended or adjusted under 35 U.S.C. 154(b) by 105 days.

(21) Appl. No.: 12/030,959

(22) Filed: Feb. 14, 2008

(65) Prior Publication Data

US 2008/0305410 A1    Dec. 11, 2008

(30) Foreign Application Priority Data

Jun. 5, 2007   (KR) .......................... 10-2007-0055108

(51) Int. Cl.
   G03H 1/04     (2006.01)
   G03F 7/00     (2006.01)
   B82Y 10/00    (2011.01)
   B82Y 40/00    (2011.01)

(52) U.S. Cl.
   CPC ............... *G03F 7/0002* (2013.01); *B82Y 10/00* (2013.01); *B82Y 40/00* (2013.01)
   USPC .......................................................... 430/5

(58) Field of Classification Search
   USPC ............................................. 430/5, 325, 326
   See application file for complete search history.

(56) References Cited

U.S. PATENT DOCUMENTS

2003/0138704 A1*   7/2003   Mei et al. ........................... 430/5
2007/0262936 A1*  11/2007   Chang et al. ...................... 345/87

FOREIGN PATENT DOCUMENTS

| JP | 2003-272998    | 9/2003  |
| JP | 2005077844 A   | 3/2005  |
| KR | 20030080183 A  | 10/2003 |
| KR | 20050066745 A  | 6/2005  |
| KR | 1020050112940 A| 12/2005 |

* cited by examiner

*Primary Examiner* — Larry Thrower
(74) *Attorney, Agent, or Firm* — Cantor Colburn LLP

(57) ABSTRACT

An imprinting device includes a first substrate, a light blocking layer formed on the first substrate corresponding to a light blocking area, and a patterned layer formed on the first substrate. The patterned layer includes an etch pattern and a flow control pattern formed on the first substrate corresponding to a transmittance area and the light blocking area, respectively. When the patterned layer presses a resin layer, the resin layer pressed by the etch pattern moves towards the flow control pattern or a photosensitive resin layer pressed by the flow control pattern moves towards the etch pattern according to a shape of the flow control pattern. Thus, when the shape of the flow control pattern is controlled, the resin layer pressed by the patterned layer may be formed with a uniform thickness.

9 Claims, 17 Drawing Sheets

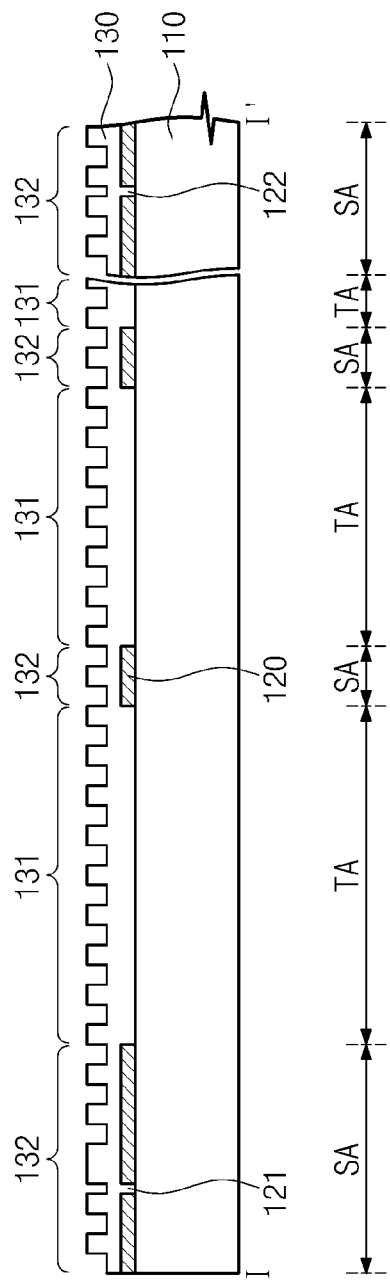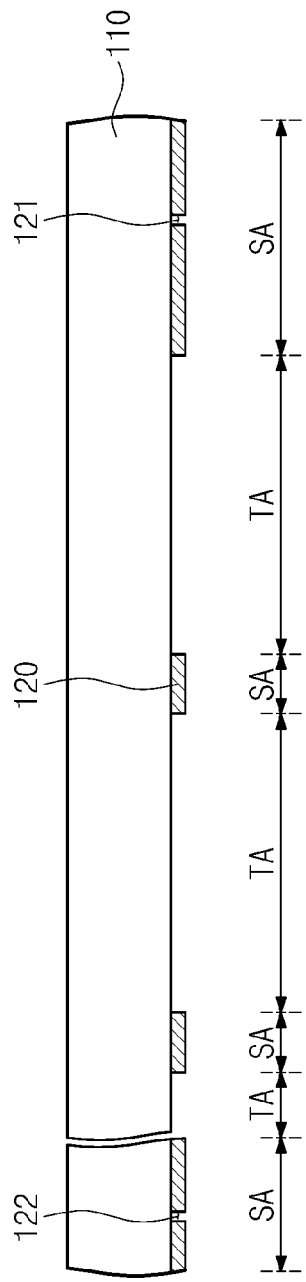

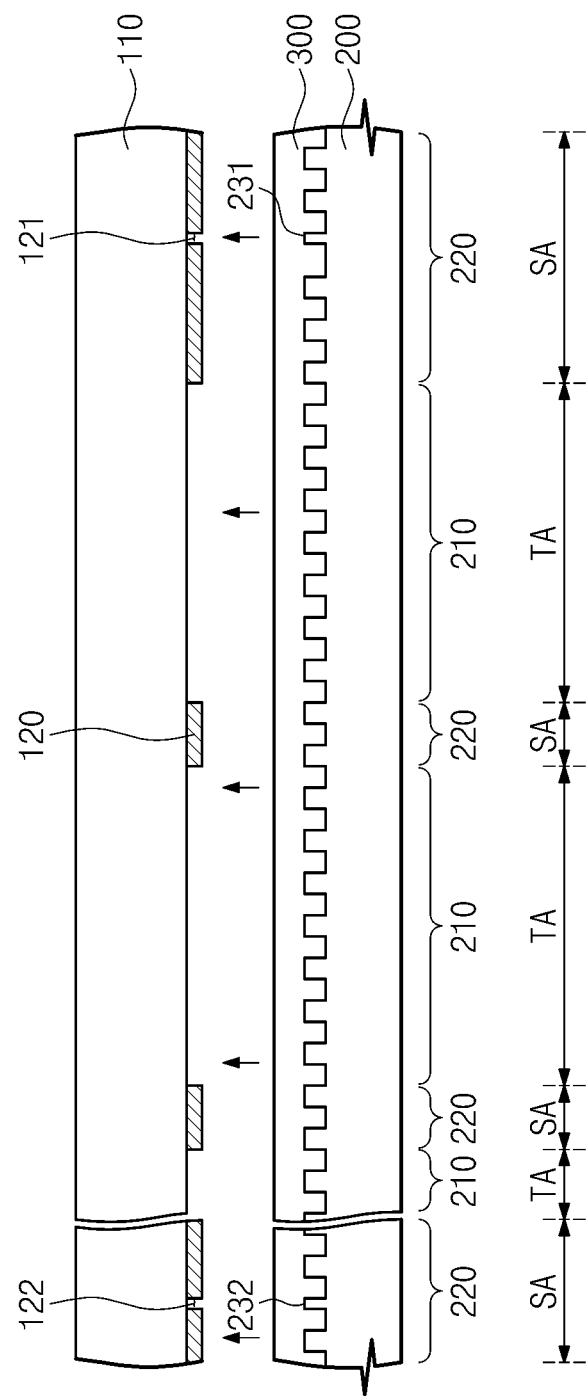

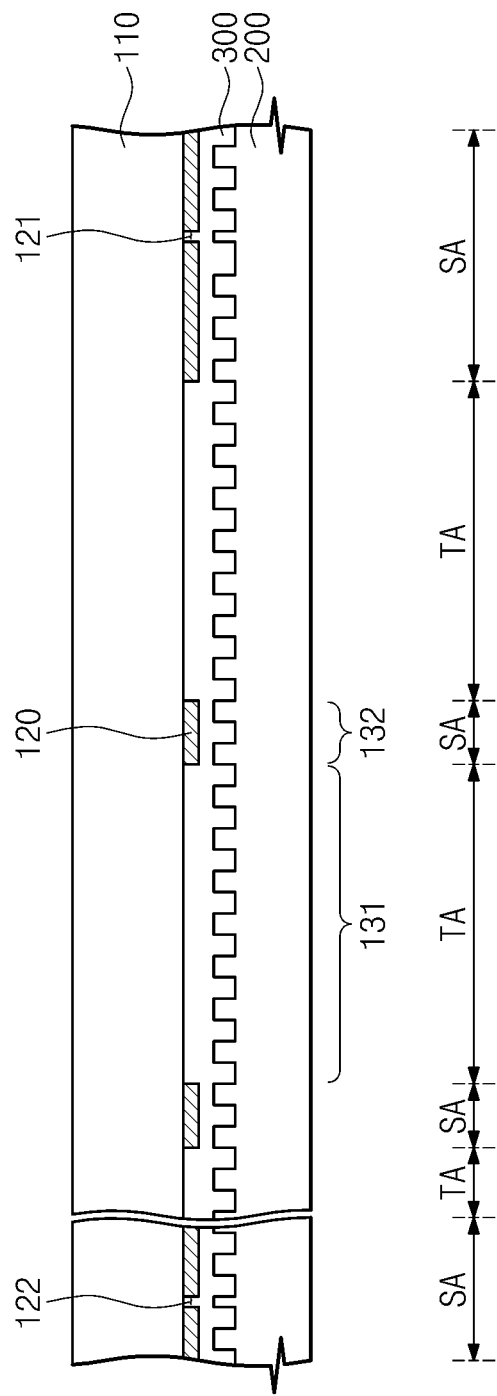

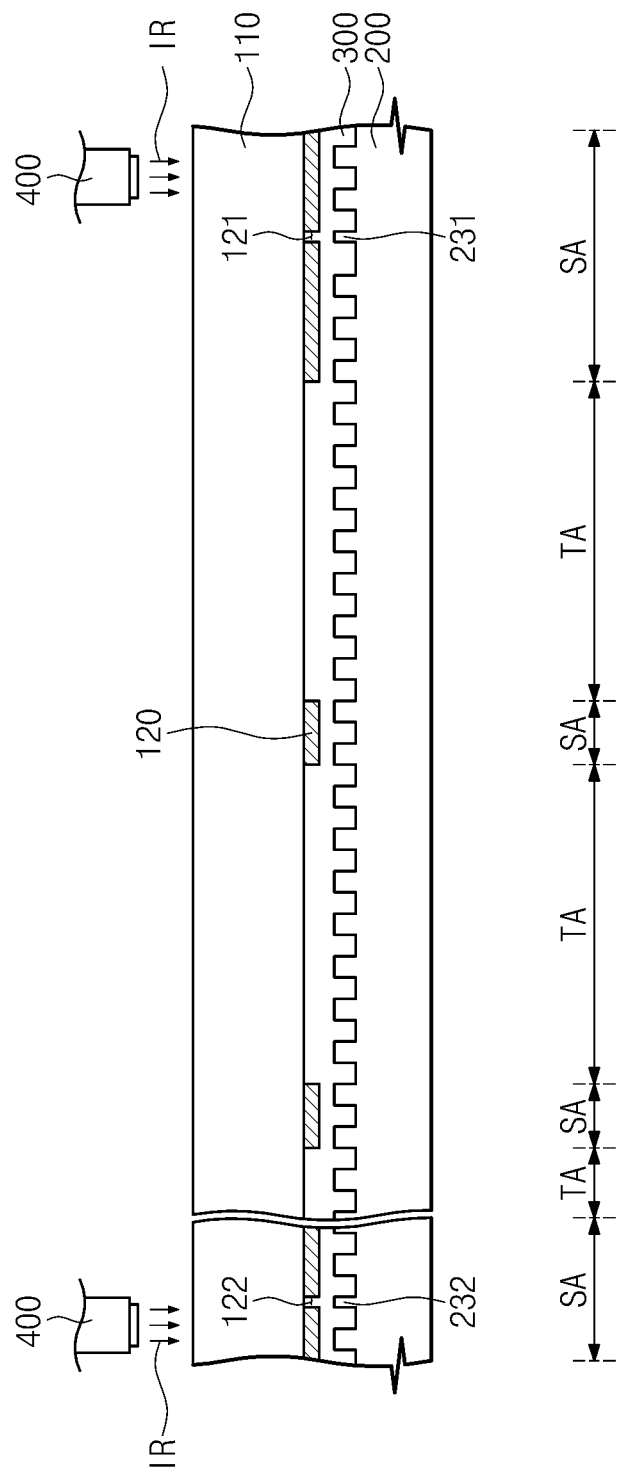

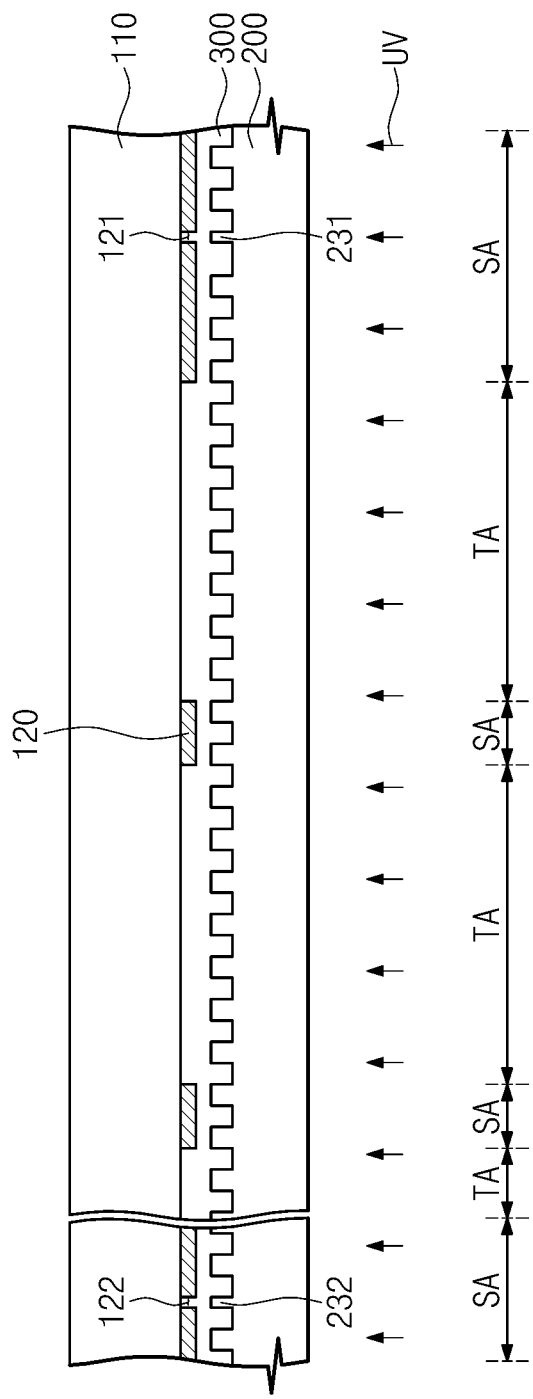

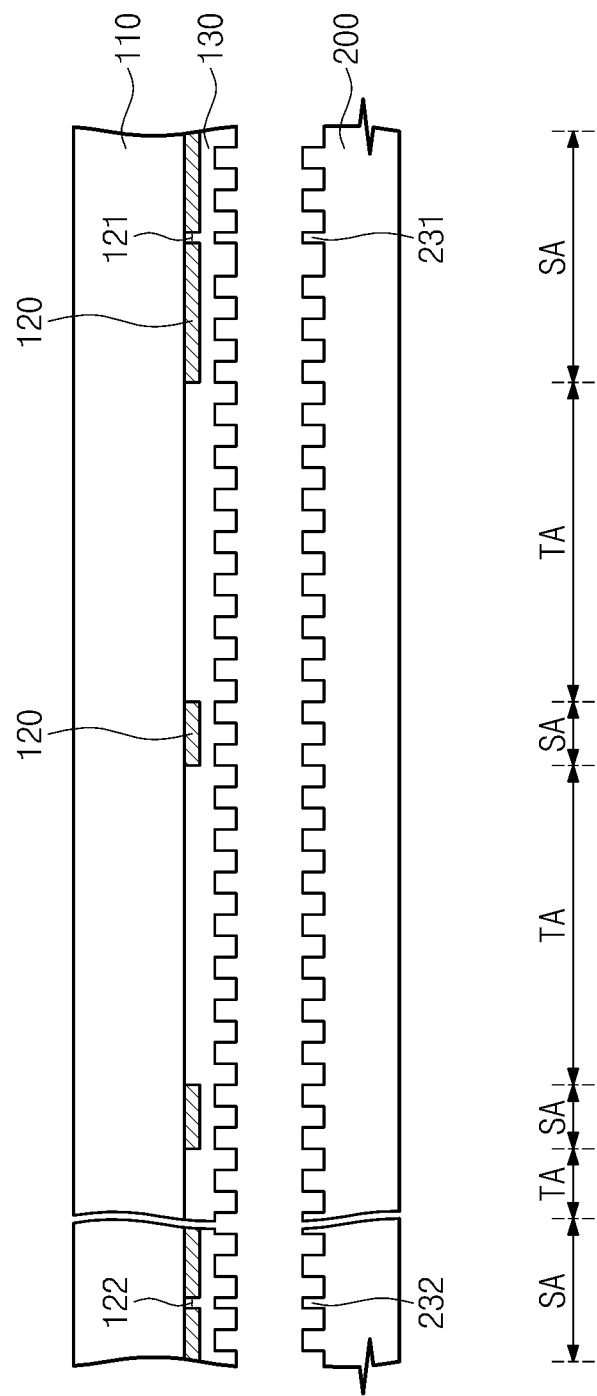

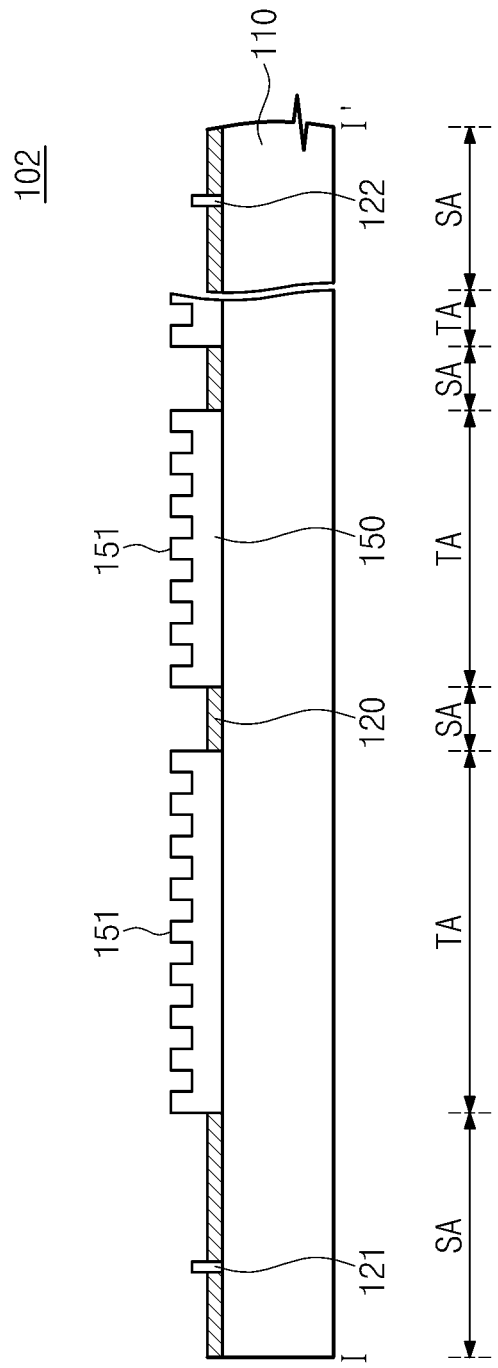

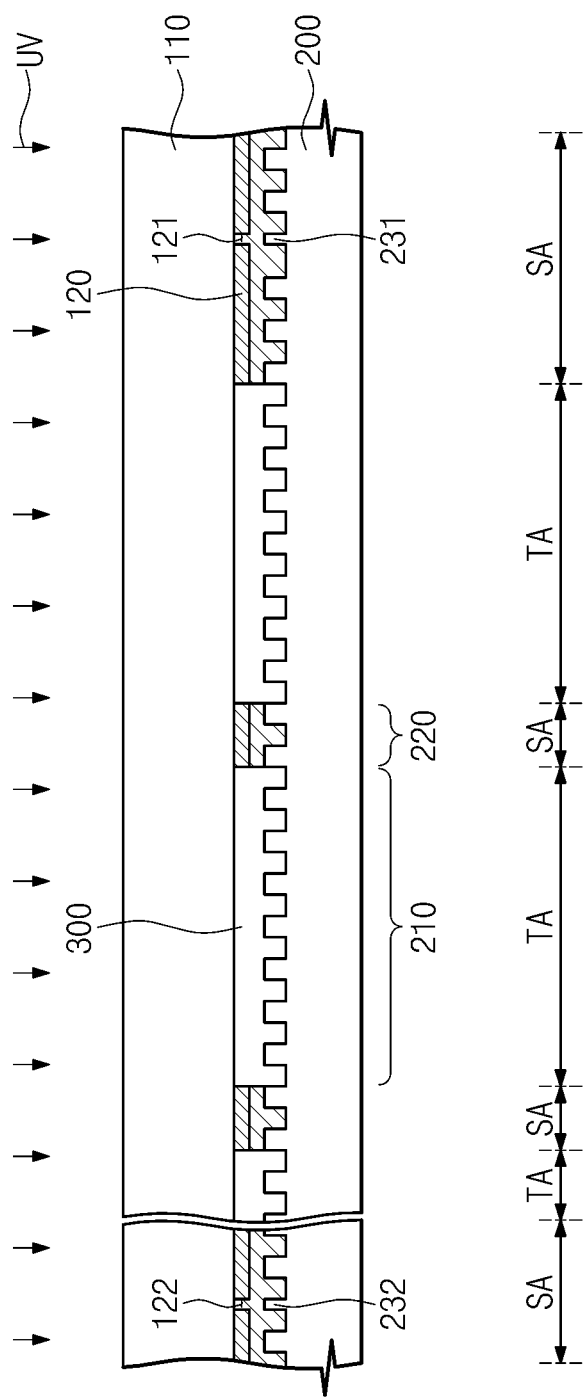

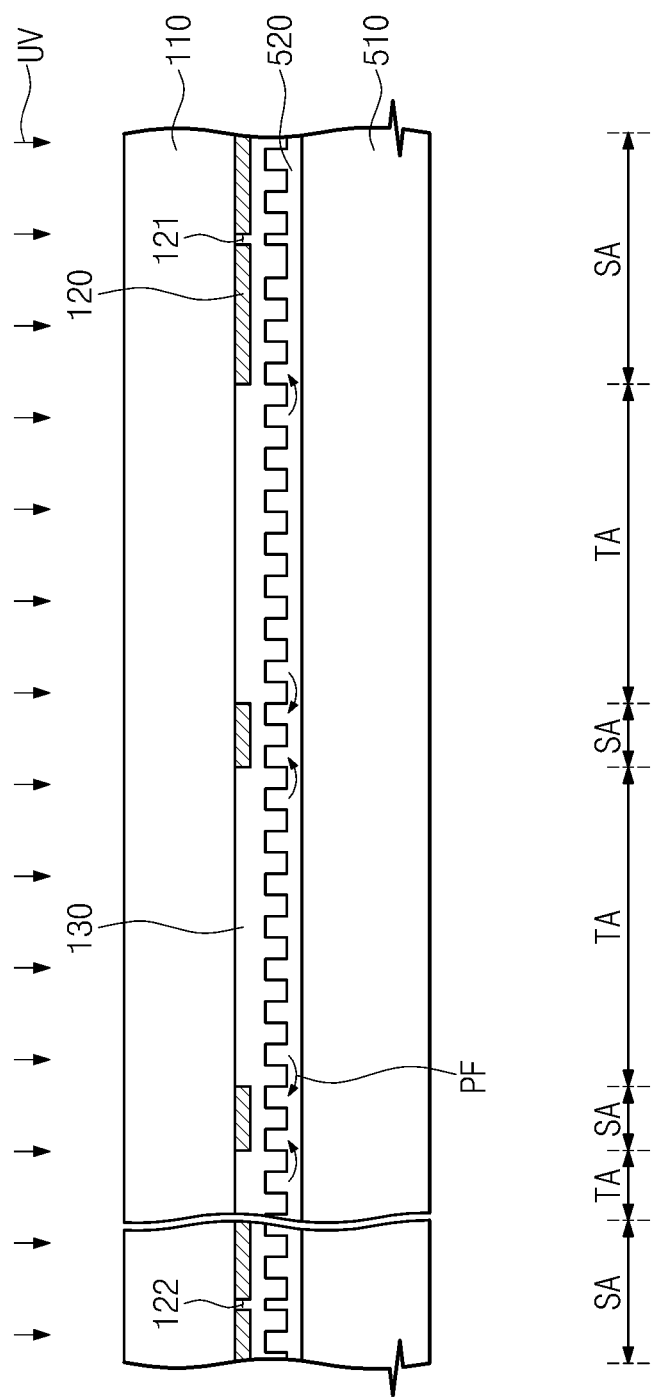

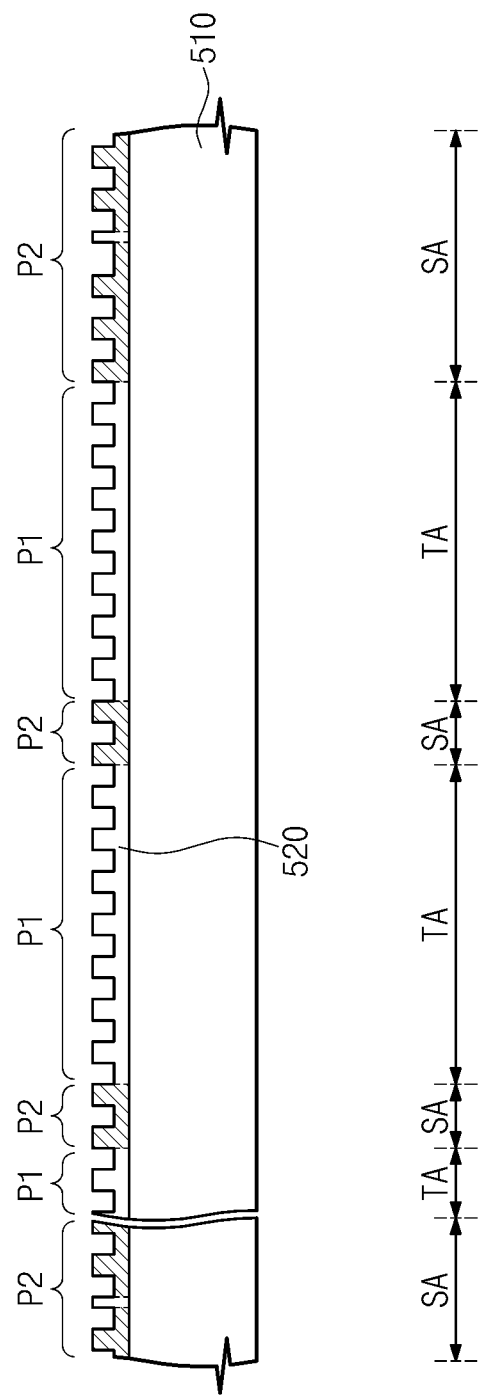

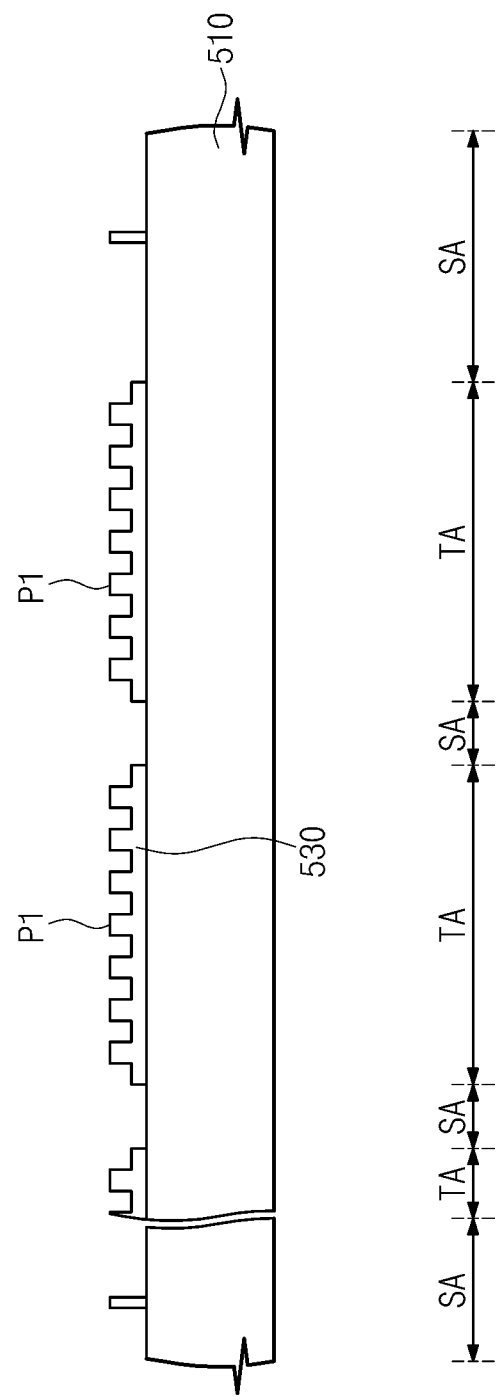

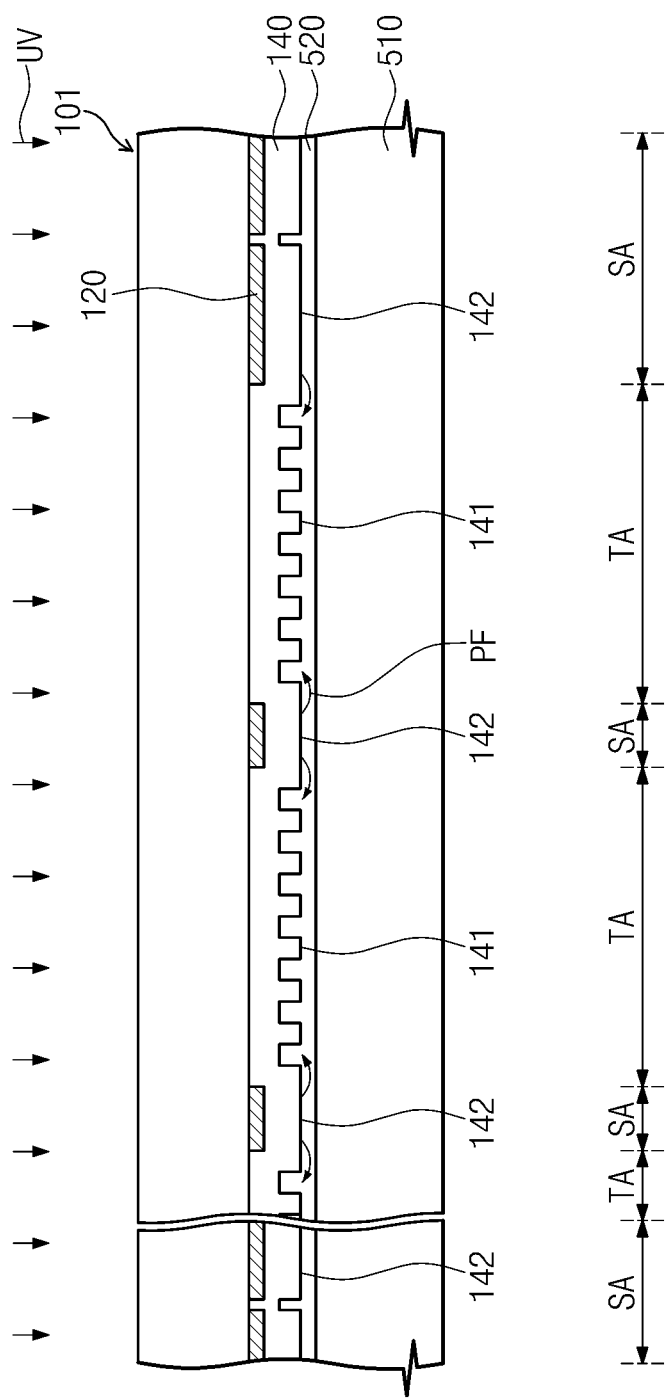

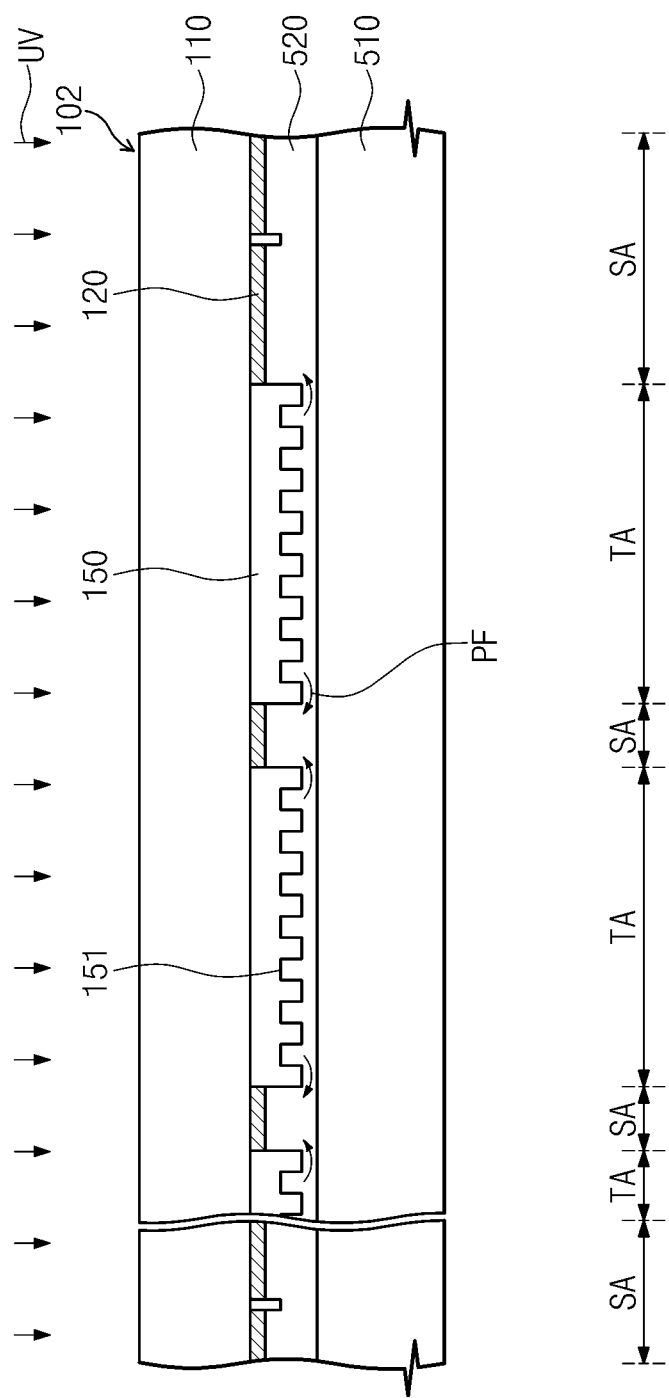

IMPRINTING DEVICE, METHOD OF FABRICATING THE SAME, AND METHOD OF PATTERNING THIN FILM USING THE SAME

This application claims priority to Korean Patent Application No. 2007-55108 filed on Jun. 5, 2007, and all the benefits accruing therefrom under 35 U.S.C. §119, the contents of which in its entirety are herein incorporated by reference.

BACKGROUND OF THE INVENTION

1. Field of the Invention

The present invention relates to an imprinting device, a method of fabricating the imprinting device, and a method of patterning a thin film using the imprinting device. More particularly, the present invention relates to an imprinting device capable of uniformly forming a pattern on a substrate, a method of fabricating the imprinting device, and a method of patterning a thin film using the imprinting device.

2. Description of the Related Art

In general, a nano-imprint technology is used to form a fine pattern of a nano-scale and is widely applied to form various devices, such as a liquid crystal display ("LCD") panel and a semiconductor chip, on which thin films having the fine pattern are formed. According to a thin film etching process using the nano-imprint technology, a thin film is pressed by a mold substrate having a concavo-convex pattern formed thereon in order to pattern the thin film according to the concavo-convex pattern. When using the nano-imprint technology, the thin film patterning process is simplified, thereby improving productivity and reducing a manufacturing cost.

According to the nano-imprint technology, the thin film is flowed to be patterned through pressing the mold substrate to the thin film. Thus, a uniformity of the patterned thin film is decided by a flow amount, a flow direction, and a flow speed of the thin film, and the flow amount and the flow direction are decided by the pattern of the mold substrate.

BRIEF SUMMARY OF THE INVENTION

Since a conventional mold pattern is not formed in consideration of a flow amount and a flow speed of a thin film, the flow amount and the flow speed of the thin film are difficult to be controlled while the thin film is pressed by the conventional mold substrate. As a result, the thin film is irregularly formed, so that an unnecessary part of the thin film is not completely removed after detaching the mold substrate.

Thus, the present invention provides an imprinting device capable of improving a uniformity of a thin film and preventing a residual layer from remaining.

The present invention also provides a method of fabricating the imprinting device.

The present invention also provides a method of patterning a thin film using the imprinting device.

In exemplary embodiments of the present invention, an imprinting device includes a first substrate, a light blocking layer, and a patterned layer.

The first substrate includes at least one transmittance area through which a light is transmitted and at least one light blocking area adjacent to the at least one transmittance area and blocking the light. The light blocking layer is formed on the first substrate corresponding to the at least one light blocking area to block the light and has at least one alignment key formed by partially removing a portion therefrom.

The patterned layer is formed on the first substrate to press an imprinting object. The patterned layer includes an etch pattern and a flow control pattern. The etch pattern is formed on the first substrate corresponding to the at least one transmittance area and may have a concavo-convex shape.

The flow control pattern is formed on the first substrate corresponding to the at least one light blocking area while covering the light blocking layer to control a flow of the imprinting object that is pressed by the patterned layer. The flow control pattern may have various shapes in order to control the flow of the imprinting object that is pressed by the patterned layer.

For instance, the flow control pattern and the etch pattern may have a same shape. That is, when the etch pattern has a shape in which a certain pattern is repeatedly formed, the flow control pattern may have the same shape as the etch pattern.

Also, the flow control pattern may have a convex shape. When the flow control pattern has the convex shape, the imprinting object pressed by the convex portion of the flow control pattern moves towards the etch pattern adjacent to the flow control pattern while the flow control pattern and the etch pattern press the imprinting object.

When the flow control pattern has a concave shape, the imprinting object pressed by the concavo-convex portion of the etch pattern moves towards the flow control pattern adjacent to the etch pattern while the flow control pattern and the etch pattern press the imprinting object.

In other exemplary embodiments of the present invention, a method of fabricating an imprinting device is provided as follows. A light blocking layer is formed corresponding to a light blocking area on a first substrate on which a transmittance area and the light blocking area adjacent to the transmittance area are defined. A second substrate provided with a first mold pattern and a second mold pattern formed on an upper face thereof is arranged such that an upper face of the second substrate faces the light blocking layer of the first substrate. A resin layer may be formed on the first substrate. The first substrate and the second substrate are combined with each other while interposing the resin layer therebetween to form an etch pattern corresponding to the first mold pattern on the resin layer corresponding to the transmittance area and to form a flow control pattern corresponding to the second mold pattern on the resin layer corresponding to the light blocking area. When the resin layer on which the etch pattern is formed is cured, a patterned layer is formed on the first substrate, and the second substrate is separated from the patterned layer.

In still other exemplary embodiments of the present invention, a method of patterning a thin film is provided as follows.

A photosensitive resin layer is formed on a base substrate and an imprinting device is arranged on the photosensitive resin layer. The imprinting device includes a light blocking layer blocking a light and a patterned layer having an etch pattern and a flow control pattern formed thereon while covering the light blocking layer. When the photosensitive resin layer is pressed by the imprinting device, a first mold pattern and a second mold pattern are formed on the photosensitive resin layer according to the etch pattern and the flow control pattern, respectively. The photosensitive resin layer on which the second mold pattern is formed is removed through a photolithography process using the imprinting device as a mask to form a thin film layer on the base substrate.

According to the above, the imprinting device controls the flow of the photosensitive resin layer that is pressed by the patterned layer of the imprinting device using the flow control pattern. Since the imprinting device uniformly presses the photosensitive resin layer in both regions where the thin film layer is formed and the thin film layer is removed, the imprinting device may uniformly pattern the photosensitive resin layer.

BRIEF DESCRIPTION OF THE DRAWINGS

The above and other features and advantages of the present invention will become readily apparent by reference to the following detailed description when considered in conjunction with the accompanying drawings wherein:

FIG. 2 is a cross-sectional view taken along line I-I' shown in FIG. 1;

FIGS. 3A to 3F are sectional views illustrating an exemplary fabrication method of an exemplary imprinting device of FIG. 2;

FIG. 6 is a sectional view showing another exemplary embodiment of an imprinting device according to the present invention;

FIG. 7 is a sectional view illustrating an exemplary fabrication method of an exemplary imprinting device of FIG. 6;

FIGS. 8A to 8D are sectional views illustrating an exemplary method of patterning an exemplary thin film using an exemplary imprinting device of FIG. 2;

FIG. 9 is a sectional view illustrating an exemplary method of patterning an exemplary thin film using the exemplary imprinting device of FIG. 4; and FIG. 10 is a sectional view illustrating an exemplary method of patterning an exemplary thin film using the exemplary imprinting device of FIG. 6.

DETAILED DESCRIPTION OF THE INVENTION

Figure 1:
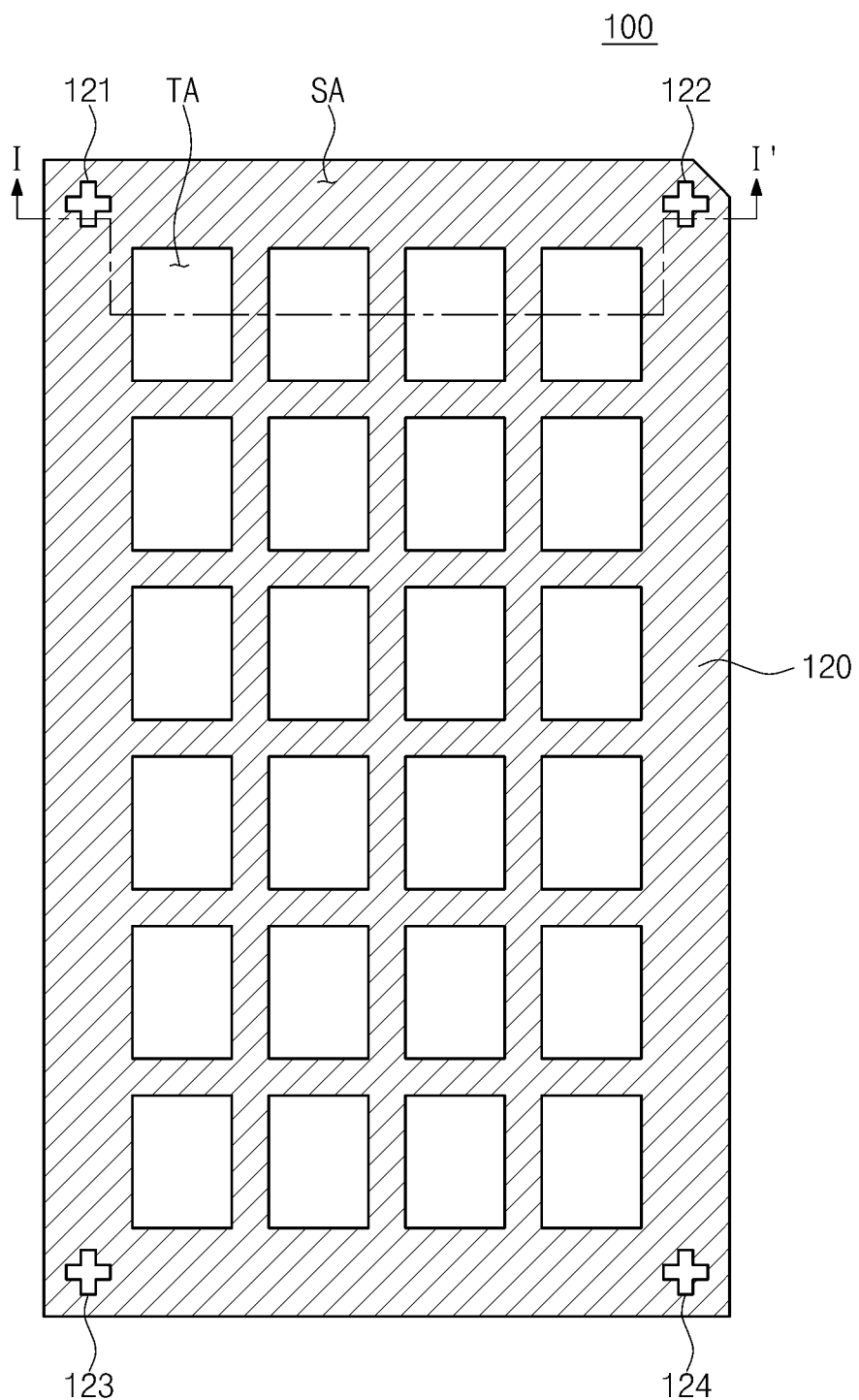
FIG. 1 is a plan view showing an exemplary embodiment of an imprinting device according to the present invention.

Hereinafter, exemplary embodiments of the present invention will be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers, films, and regions are exaggerated for clarity.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the invention.

Hereinafter, the present invention will be described in detail with reference to the accompanying drawings.

FIG. 1 is a plan view showing an exemplary embodiment of an imprinting device according to the present invention, and FIG. 2 is a cross-sectional view taken along line I-I' shown in FIG. 1.

Referring to FIGS. 1 and 2, an imprinting device 100 includes a first substrate 110, a light blocking layer 120, and a patterned layer 130. The imprinting device 100 is applied to pattern a thin film layer for a display device or a semiconductor device.

The first substrate 110 includes at least one transmittance area TA through which a light is transmitted and at least one light blocking area SA that is adjacent to the transmittance area TA and blocks the light.

The light blocking layer 120 is formed on the first substrate 110 corresponding to the light blocking area SA, and the light blocking layer 120 may include a metal thin film or an organic material having a carbon in order to prevent the light from being transmitted therethrough. The light blocking layer 120 may be formed on a first surface of the first substrate 110.

In the present exemplary embodiment, the light blocking layer 120 is formed only in the light blocking area SA, however, the light blocking layer 120 may alternatively be partially formed in the transmittance area TA in accordance with a pattern of the thin film layer.

Also, portions of the light blocking layer 120 are partially removed to form first, second, third, and fourth mold alignment keys 121, 122, 123, and 124. In FIG. 1, the imprinting device 100 includes four mold alignment keys 121~124, however, the number of the mold alignment keys may increase or decrease according to a size of the imprinting device 100. The first to fourth mold alignment keys 121~124 are positioned adjacent to four corners of the first substrate 110, respectively. The first to fourth mold alignment keys 121~124 are used to align the first substrate 110 and an external device during a process that forms the imprinting device 100 or during a process that patterns a thin film using the imprinting device 100.

The patterned layer 130 is formed on the first substrate 110 on which the light blocking layer 120 is formed. That is, the patterned layer 130 is formed on the first surface of the first substrate 110 overlapping the light blocking layer 120. The patterned layer 130 covers the light blocking layer 120 and includes a resin material that transmits a light. The patterned layer 130 includes an etch pattern 131 and a flow control pattern 132 formed at an upper portion thereof. The etch pattern 131 is formed corresponding to the transmittance area TA and has a concavo-convex shape. The flow control pattern 132 is repeatedly formed corresponding to the light blocking area SA and overlapping the light blocking layer 120. The flow control pattern 132 and the etch pattern 131 have a same shape.

The imprinting device 100 patterns the thin film layer according to the shapes of the etch pattern 131 and the flow control pattern 132.

Hereinafter, an exemplary fabrication process of the imprinting device 100 will be described in detail with reference to FIGS. 3A to 3F.

FIGS. 3A to 3F are sectional views illustrating an exemplary fabrication method of the exemplary imprinting device of FIG. 2.

Referring to FIGS. 3A and 3B, a metal thin film that blocks light is deposited on the first surface of the first substrate 110.

As an example of the present embodiment, the light blocking layer 120 is formed by patterning a metal thin film layer including chromium (Cr), however, other metal thin films may alternatively be deposited and patterned to form the light blocking layer 120. In another exemplary embodiment, the light blocking layer 120 may be formed by patterning an organic material thin film including carbon instead of the metal thin film.

After the metal thin film is formed on the first substrate 110, a photolithography process is performed with respect to the metal thin film, so that the light blocking layer 120 is formed in the light blocking area SA and includes the first to fourth mold alignment keys 121~124.

Then, a second substrate 200 is arranged under the first substrate 110, so as to face the first surface of the first substrate 110. The second substrate 200 includes a material that transmits light and is easily separated from a resin layer, and a first mold pattern 210 and a second mold pattern 220 are formed on the second substrate 200. The first mold pattern 210 and the second mold pattern 220 may be formed on a first surface of the second substrate 200, where the first surface of the second substrate 200 faces the first surface of the first substrate 110. The first mold pattern 210 is formed in a region corresponding to the transmittance area TA and has a concavo-convex shape. Also, the second mold pattern 220 is formed in a region corresponding to the light blocking area SA and has the concavo-convex shape.

The second mold pattern 220 has a same shape as that of the first mold pattern 210. That is, the first mold pattern 210 has a shape in which a certain shape is repeatedly formed, and the second mold pattern 220 has the same shape as the certain shape of the first mold pattern 210.

The second substrate 200 includes one or more master alignment keys 231 and 232 each corresponding to one mold alignment key among the first to fourth mold alignment keys 121~124 (shown in FIG. 1). The master alignment keys 231 and 232 are formed on the second substrate 200 and are protruded therefrom. When the first substrate 110 is arranged in a facing relationship to the second substrate 200, the first master alignment key 231 is positioned in a region of the second substrate 200 corresponding to a region in which the first mold alignment key 121 is formed on the first substrate 110, and the second master alignment key 232 is positioned in a region of the second substrate 200 corresponding to a region in which the second mold alignment key 122 is formed on the first substrate 110. The first substrate 110 and the second substrate 200 are aligned according to a position relation between the mold alignment keys 121~124 and the master alignment keys 231 and 232. The number of master alignment keys on the second substrate 200 may be the same as the number of mold alignment keys on the first substrate 110.

When the second substrate 200 is arranged under the first substrate 110, the second substrate 200 is arranged such that the first surface of the second substrate 200, on which the first and second mold patterns 210 and 220 are formed, faces first surface of the first substrate 110, on which the light blocking layer 120 is formed.

After arranging the second substrate 200 to face the first substrate 110, a resin layer 300 is deposited on the first surface of the second substrate 200. Although it is illustrated in FIG. 3B that the resin layer 300 is deposited on the second substrate 200, in an alternative exemplary embodiment, the resin layer 300 may instead be deposited on the first surface of the first substrate 110. In an exemplary embodiment, the resin layer 300 may include polydimethylsiloxane ("PDMS"). Since an adsorptivity between the resin layer 300 including the PDMS and the first substrate 110 is better than an adsorptivity between the resin layer 300 and the second substrate 200, the resin layer 300 may be easily separated from the second substrate 200 after the resin layer 300 is molded by the second substrate 200.

Referring to FIG. 3C, the first substrate 110 and the second substrate 200 are combined with each other while interposing the resin layer 300 therebetween. Thus, the etch pattern 131 is formed at a position where the resin layer 300 makes contact with the second substrate 200 according to the first mold pattern 210 (shown in FIG. 3B) corresponding to the transmittance area TA, and the flow control pattern 132 is formed at a position where the resin layer 300 makes contact with the second substrate 200 according to the second mold pattern 220 (shown in FIG. 3B) corresponding to the light blocking area SA. The etch pattern 131 has a shape opposite to that of the first mold pattern 210, and the flow control pattern 132 has a shape opposite to that of the second mold pattern 220. That is, a concave portion of the etch pattern 131 is formed by a convex portion of the first mold pattern 210, and a convex portion of the etch pattern 131 is formed by a concave portion of the first mold pattern 210.

Referring to FIG. 3D, a light source 400 irradiating an infrared ray ("IR") is arranged above the first substrate 110, with respect to a second surface of the first substrate 110 opposite to the first surface of the first substrate 110 on which the light blocking layer 120 is formed, and a camera (not shown) is arranged under the second substrate 200, with respect to a second surface of the second substrate 200 opposite to the first surface of the second substrate 200. The light source 400 is arranged corresponding to each of the mold alignment keys 121~124 (shown in FIG. 1) and irradiates the IR onto the first substrate 110. The camera recognizes positions of each of the mold alignment keys 121~124 and corresponding master alignment keys 231 and 232 using the IR, and aligns the mold alignment keys 121~124 with respect to the corresponding master alignment keys 231 and 232. Thus, the first substrate 110 and the second substrate 200 are aligned.

Referring to FIGS. 3E and 3F, a light is irradiated onto the resin layer 300 from under the second substrate 200 in order to cure the resin layer 300, so that the patterned layer 130 is formed on the first substrate 110. In an exemplary embodiment, an ultraviolet ray ("UV") is irradiated onto the resin layer 300 from under the second substrate 200 in order to cure the resin layer 300. In other words, the UV is irradiated onto the second surface of the second substrate 200. Then, the second substrate 200 is separated from the patterned layer 130.

Figure 4:
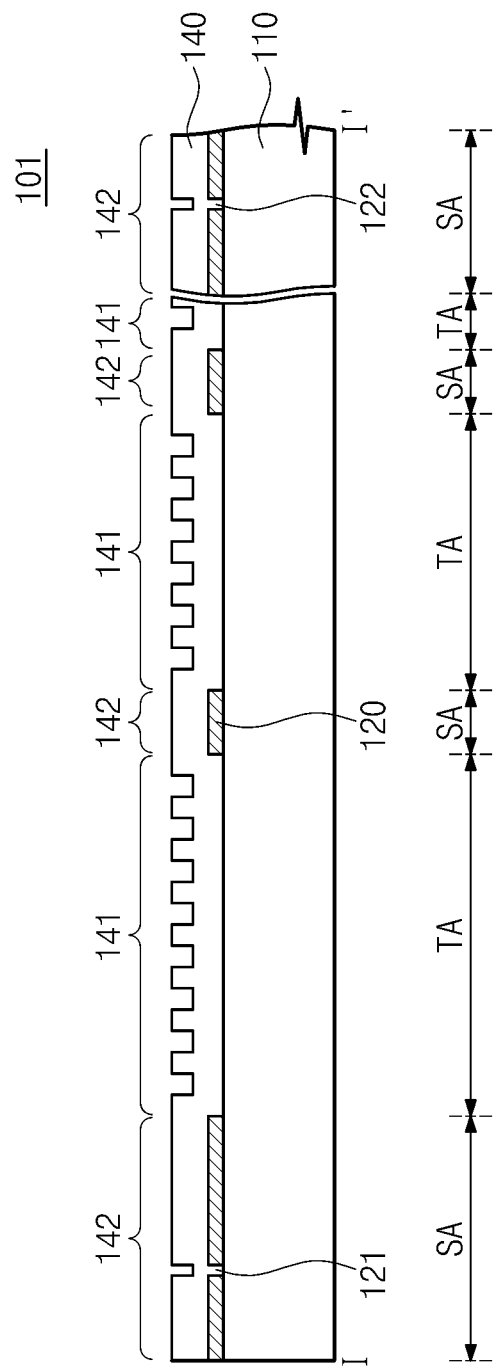
FIG. 4 is a sectional view showing another exemplary embodiment of an imprinting device according to the present invention.

FIG. 4 is a sectional view showing another exemplary embodiment of an imprinting device according to the present invention. In FIG. 4, the same reference numerals denote the same elements in FIGS. 1 and 2, and thus detailed descriptions of the same elements will be omitted.

Referring to FIG. 4, an imprinting device 101 includes a first substrate 110, a light blocking layer 120, and a patterned layer 140. The first substrate 110 includes at least one transmittance area TA and at least one light blocking area SA adjacent to the transmittance area TA defined thereon, and the light blocking layer 120 is formed on the first surface of the first substrate 110 corresponding to the light blocking area SA. The patterned layer 140 is formed on the first surface of the first substrate 110 on which the light blocking layer 120 is formed to cover the light blocking layer 120 and includes a resin material.

Particularly, the patterned layer 140 includes an etch pattern 141 formed in the transmittance area TA and a flow control pattern 142 formed in the light blocking area SA. The etch pattern 141 is formed on the patterned layer 140 corresponding to the transmittance area TA and has a concavo-convex shape. The flow control pattern 142 is formed on the patterned layer 140 corresponding to the light blocking area SA. In the present exemplary embodiment, the flow control pattern 142 has a convex shape, however, the flow control pattern 142 may alternatively have a concave shape. The imprinting device 101 patterns a thin film layer using the shapes of the etch pattern 141 and the flow control pattern 142.

Figure 5:
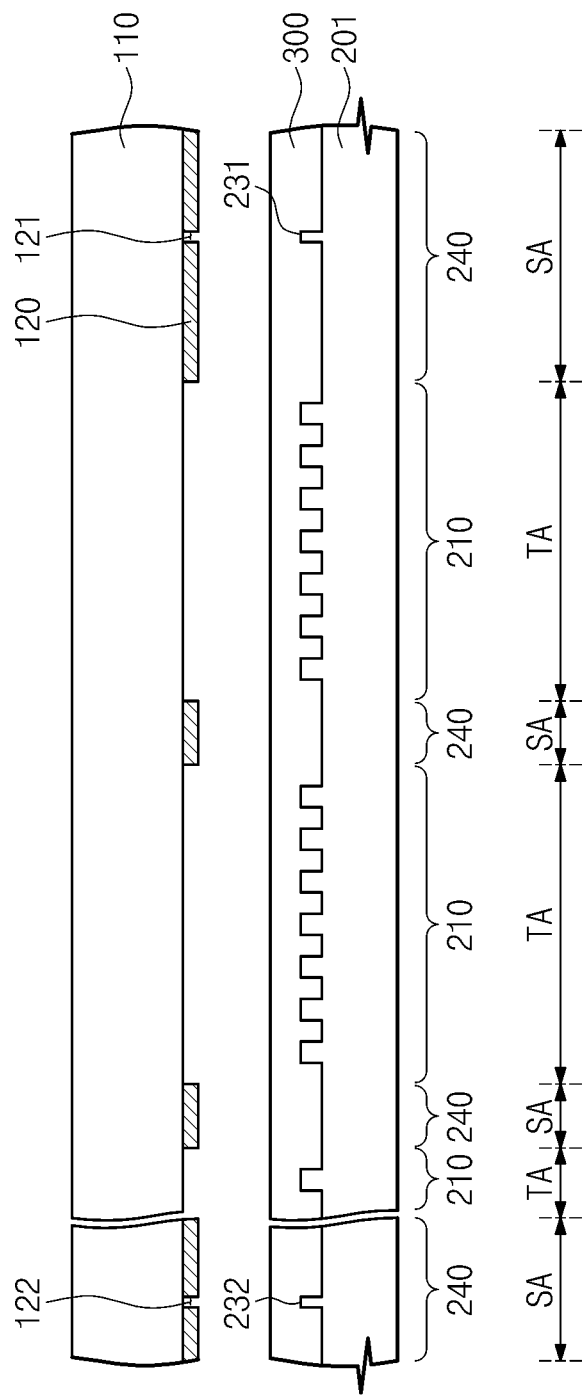
FIG. 5 is a sectional view illustrating an exemplary fabrication method of an exemplary imprinting device of FIG. 4.
Figure 8A:
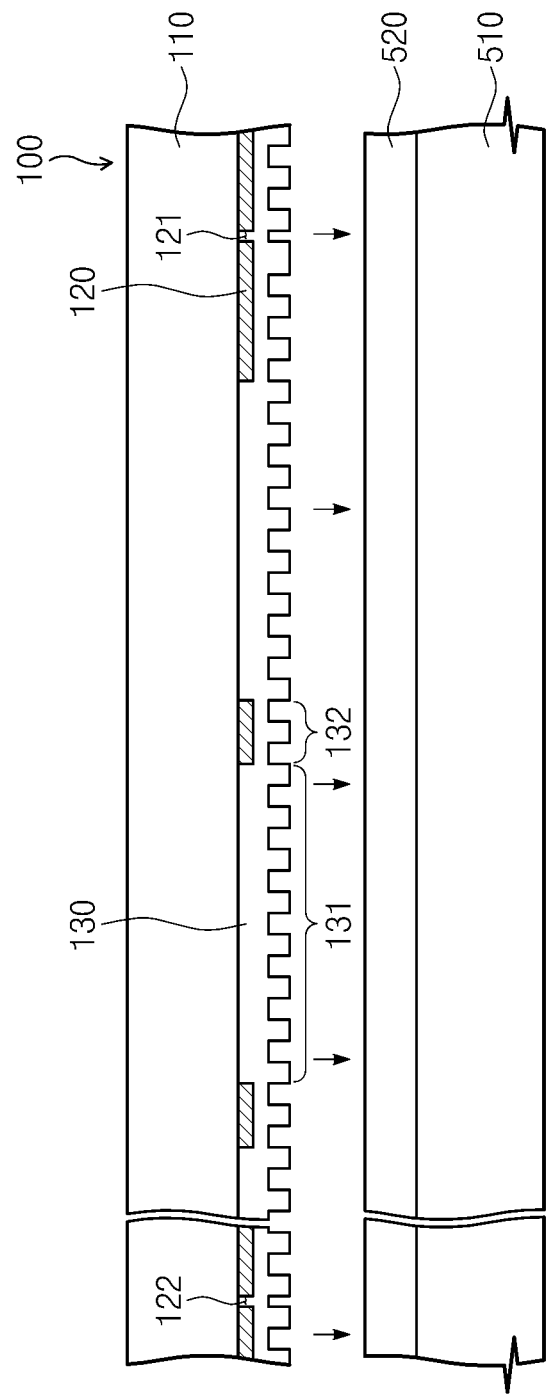

FIG. 5 is a sectional view illustrating an exemplary fabrication method of the exemplary imprinting device of FIG. 4.

Referring to FIGS. 4 and 5, the light blocking layer 120 is formed on the first surface of the first substrate 110 corresponding to the light blocking area SA, and a second substrate 201 is arranged under the first substrate 110, such that a first surface of the second substrate 201 faces the first surface of the first substrate 110.

The second substrate 201 includes a first mold pattern 210 and a second mold pattern 240 formed on the first surface of the second substrate 201. The first mold pattern 210 is formed in a region corresponding to the transmittance area TA and has a concavo-convex shape. The second mold pattern 240 is formed in a region corresponding to the light blocking area SA and has a concave shape. Also, the second substrate 201 includes master alignment keys 231 and 232 each corresponding to one mold alignment key among first to fourth mold alignment keys 121~124 (shown in FIG. 1) that are formed on the light blocking layer 120.

When the second substrate 201 is placed under the first substrate 110, the second substrate 201 is arranged such that the first surface of the second substrate 201, on which the first and second mold patterns 210 and 240 are formed, faces the first surface of the first substrate 110, on which the light blocking layer 120 is formed.

A resin layer 300 is deposited on the second substrate 201, and the first substrate 110 and the second substrate 201 are combined with each other. Although it is illustrated in FIG. 5 that the resin layer 300 is deposited on the second substrate 201, in an alternative exemplary embodiment, the resin layer 300 may instead be deposited on the first surface of the first substrate 110. Then, the resin layer 300 is cured in order to form the patterned layer 140. Since the process that forms the patterned layer 140 may be substantially the same as the process that forms the patterned layer 130 shown in FIGS. 3B to 3F, the detailed descriptions of the process for forming the patterned layer 140 will be omitted.

The etch pattern 141 and the flow control pattern 142 are formed at a position where the resin layer 300 makes contact with the second substrate 201 through the process of combining the first substrate 110 with the second substrate 201.

Particularly, the etch pattern 141 is formed according to the first mold pattern 210 of the second substrate 201, and the flow control pattern 142 is formed according to the second mold pattern 240 of the second substrate 201. In the present exemplary embodiment, since the second mold pattern 240 has a concave shape, the flow control pattern 142 has the convex shape.

FIG. 6 is a sectional view showing another exemplary embodiment of an imprinting device according to the present invention. In FIG. 6, the same reference numerals denote the same elements in FIGS. 1 and 2, and thus detailed descriptions of the same elements will be omitted.

Referring to FIG. 6, an imprinting device 102 includes a first substrate 110, a light blocking layer 120, and a patterned layer 150. The first substrate 110 includes at least one transmittance area TA and at least one light blocking area SA defined thereon, and the light blocking layer 120 is formed on the first surface of the first substrate 110 corresponding to the light blocking area SA. The patterned layer 150 is formed on the first surface of the first substrate 110 corresponding to the transmittance area TA.

Particularly, the patterned layer 150 includes a resin material, and an etch pattern 151 having a concavo-convex shape is formed on the patterned layer 150. The patterned layer 150 is removed from the light blocking area SA, so that the light blocking layer 120 is exposed.

FIG. 7 is a sectional view illustrating an exemplary fabrication method of the exemplary imprinting device of FIG. 6.

Referring to FIGS. 6 and 7, the light blocking layer 120 is formed in the light blocking area SA of the first substrate 110, and a second substrate 200 is arranged under the first substrate 110, such that a first surface of the second substrate 200 faces the first surface of the first substrate 110. Since the second substrate 200 may have a same structure and function as the second substrate 200 shown in FIGS. 3A to 3E, the same reference numerals are assigned to the same elements and detailed descriptions of the same elements will be omitted.

The second substrate 200 is arranged such that the first surface of the first substrate 110, on which the light blocking layer 120 is formed, faces the first surface of the second substrate 200, on which first and second mold patterns 210 and 220 are formed. Then, the resin layer 300 is formed on the first substrate 110, and the first substrate 110 and the second substrate 200 are combined with each other while interposing the resin layer 300 therebetween. Alternatively, the resin layer 300 may be formed on the second substrate 200 prior to combining the first substrate 110 with the second substrate 200. Thus, the etch pattern 151 is formed at a position where the resin layer 300 makes contact with the second substrate 200 corresponding to the transmittance area TA by the first mold pattern 210. Also, a surface of the resin layer 300 that makes contact with the second substrate 200 is patterned according to the second mold pattern 220 in the light blocking area SA.

Then, an ultraviolet ray ("UV") is irradiated onto the resin layer 300 from above the first substrate 110, with respect to a second surface of the first substrate 110, in order to expose the resin layer 300. The UV passes through the first substrate 110 corresponding to the transmittance area TA and is provided to the resin layer 300. However, the UV is blocked by the light blocking layer 120 corresponding to the light blocking area SA, so that the UV is not provided to the resin layer 300 corresponding to the light blocking area SA. Then, the second substrate 200 is separated from the resin layer 300, and the resin layer 300 is developed. Particularly, since the resin layer 300 corresponding to the transmittance area TA is exposed to the UV during the exposure process, the resin layer 300 corresponding to the transmittance area TA is not removed through the develop process. However, since the resin layer 300 corresponding to the light blocking area SA is not exposed to the UV during the exposure process, the resin layer 300 corresponding to the light blocking area SA is removed through the develop process. Thus, the patterned layer 150 is formed on the first substrate 110.

In FIG. 7, the patterned layer 150 is formed using the second substrate 200 shown in FIGS. 3A to 3F, however, the patterned layer 150 may alternatively be formed using the second substrate 201 shown in FIG. 5.

Hereinafter, an exemplary process of patterning an exemplary thin film using the above-described imprinting devices 100, 101, and 102 will be described in detail below. Since each of the imprinting devices 100, 101, and 102 has different flow control patterns, a control mechanism of flow of the resin layer formed on the base substrate by using the flow control pattern will be described.

FIGS. 8A to 8D are sectional views illustrating an exemplary method of patterning a thin film layer using the exemplary imprinting device of FIG. 2.

Referring to FIGS. 8A to 8D, a photosensitive resin layer 520 is formed on a first surface of a base substrate 510. The imprinting device 100 is arranged above the photosensitive resin layer 520 while spaced apart from the photosensitive resin layer 520. The first surface of the base substrate 510 is arranged to face the first surface of the first substrate 110 of the imprinting device 100.

The imprinting device 100 and the base substrate 510 are combined with each other while interposing the photosensitive resin layer 520 therebetween. Thus, the photosensitive resin layer 520 is pressed by the patterned layer 130 of the imprinting device 100, and as shown in FIG. 8C, a first pattern P1 and a second pattern P2 are formed on the photosensitive resin layer 520 according to the etch pattern 131 and the flow control pattern 132 of the patterned layer 130 of the imprinting device 100.

That is, the first pattern P1 having a concavo-convex shape is formed on the photosensitive resin layer 520 corresponding to the transmittance area TA of the imprinting device 100 according to the etch pattern 131, and the second pattern P2 is formed on the photosensitive resin layer 520 corresponding to the light blocking area SA of the imprinting device 100 according to the flow control pattern 132.

When the imprinting device 100 and the base substrate 510 are combined with each other as shown in FIG. 8B, a flow PF of the photosensitive resin layer 520 is controlled using the flow control pattern 132. That is, when the imprinting device 100 presses the photosensitive resin layer 520, the photosensitive resin layer 520 is pressed by convex portions of the etch pattern 131 and the flow control pattern 132, so that the photosensitive resin layer 510 is inflowed into concave portions of the etch pattern 131 and the flow control pattern 132. The portion of the photosensitive resin layer 520 that is pressed by the etch pattern 131 and moved towards a region corresponding to the light blocking area SA is inflowed into the concave portions of the flow control pattern 132. Thus, an amount of the photosensitive resin layer 520 pressed by the etch pattern 131 is relatively greater than an amount of the photosensitive resin layer 520 pressed by the flow control pattern 132, so that a phenomenon that the photosensitive resin layer 520 is not uniformly pressed by the patterned layer 130 may be prevented. Consequently, the imprinting device 100 may pattern the photosensitive resin layer 520 with a uniform thickness.

In general, when the portions of the etch pattern 131 and the flow control pattern 132 that press the photosensitive resin layer 520 are formed without consideration of the flow of the photosensitive resin layer 520, the photosensitive resin layer 520 that is pressed by the patterned layer 130 in a border area between the etch pattern 131 and the flow control pattern 132 is pressed by different pressures, so that a flow amount and a flow direction of the photosensitive resin layer 520 are difficult to be controlled. As a result, a pattern shape of the photosensitive resin layer 520 in the border area has a non-uniform profile, and a residual layer remains.

However, when the flow control pattern 132 is formed continuously from the etch pattern 131, the pressure applied to the photosensitive resin layer 520 by the etch pattern 131 and the flow control pattern 132 is uniformly applied not only to the border area but also to the entire area of the photosensitive resin layer 520. As a result, the pattern shape of the photosensitive resin layer 520 may be more uniformly formed.

Referring to FIGS. 8B and 8C, the ultraviolet ray ("UV") is irradiated onto the photosensitive resin layer 520 from above the imprinting device 100, such as through the second surface of the first substrate 110, to expose the photosensitive resin layer 520, and the imprinting device 100 is then separated from the photosensitive resin layer 520. Since the UV is blocked by the light blocking layer 120 of the imprinting device 100 in the light blocking area SA, the UV is not provided to a region corresponding to the light blocking layer 120, that is, a region where the second pattern P2 is formed on the photosensitive resin layer 520.

Then, the photosensitive resin layer 520 is developed, so that the photosensitive layer 520 where the second pattern P2 is formed is removed and the photosensitive layer 520 where the first pattern P1 is formed remains, thereby forming the thin film layer 530 on the base substrate 510 as shown in FIG. 8D. Therefore, the first pattern P1 is formed on the thin film layer 530.

The photosensitive resin layer 520 is patterned with a uniform thickness by the imprinting device 100, so that the region corresponding to the light blocking layer 120 is completely removed. Accordingly, the imprinting device 100 may improve the uniformity of the thin film layer 530. Also, since the photosensitive resin layer 520 may be partially removed using the light blocking layer 120 as a mask during the curing process for the photosensitive resin layer 520, an additional etching process applied to remove the photosensitive resin layer 520 may be omitted.

FIG. 9 is a sectional view illustrating an exemplary method of patterning an exemplary thin film using the exemplary imprinting device of FIG. 4.

Referring to FIG. 9, the photosensitive resin layer 520 is formed on the first surface of a base substrate 510. Then, the imprinting device 101 is arranged above the photosensitive resin layer 520 while spaced apart from the photosensitive resin layer 520. For example, the first surface of the base substrate 110 of the imprinting device 101 may be arranged to face the first surface of the base substrate 510.

The imprinting device 101 and the base substrate 510 are combined with each other while interposing the photosensitive resin layer 520 therebetween. Thus, the photosensitive resin layer 520 is pressed by the patterned layer 140 of the imprinting device 101, and a first pattern and a second pattern are formed on the photosensitive resin layer 520 according to the etch pattern 141 and the flow control pattern 142 of the patterned layer 140. That is, the first pattern is formed on the photosensitive resin layer 520 corresponding to the transmittance area TA according to the etch pattern 141, and the second pattern is formed on the photosensitive resin layer 520 corresponding to the light blocking area SA according to the flow control pattern 142.

When the imprinting device 101 and the base substrate 510 are combined with each other, the imprinting device 101 controls the flow PF of the photosensitive resin layer 520 using the flow control pattern 142. That is, when the imprinting device 101 presses the photosensitive resin layer 520, the photosensitive resin layer 520 is pressed by the convex portion of the etch pattern 141 and the flow control pattern 142 and the photosensitive resin layer 520 is inflowed into the concave portion of the etch pattern 141. Since the flow control pattern 142 has the convex shape, the photosensitive resin layer 520 is prevented from being inflowed into a region corresponding to the light blocking area SA. Thus, the imprinting device 101 may control the flow PF of the photosensitive resin layer 520 using the flow control pattern 142, so that the photosensitive resin layer 520 may be patterned with a uniform thickness in regions each corresponding to the transmittance area TA and the light blocking area SA.

In other words, when the flow control pattern 142 has the convex shape, the portion of the photosensitive resin layer 520 pressed by the flow control pattern 142 is inflowed into the concave portion of the etch pattern 141. As a result, an amount of the photosensitive resin layer 520 that is pressed by the flow control pattern 142 is relatively greater than an amount of the photosensitive resin layer 520 that is pressed by the etch pattern 141, so that a phenomenon that the photosensitive resin layer 520 is not uniformly pressed by the overall patterned layer 130 may be prevented. Accordingly, the imprinting device 101 may pattern the photosensitive resin layer 520 with the uniform thickness.

Then, when a photolithography process is performed using the imprinting device 101 as a mask, the photosensitive resin layer 520 on which the second pattern is formed corresponding to the light blocking layer 120 is removed, and the photosensitive resin layer 520 on which the first pattern is formed is not removed. Thus, the thin film layer 530 on which the first pattern is formed is completed on the base substrate 510.

As described above, since the photosensitive resin layer 520 is patterned with the uniform thickness by the imprinting device 101, a residual layer is completely removed from the base substrate 510 corresponding to the light blocking area SA. Thus, the imprinting device 101 may improve the uniformity of the thin film layer 530.

FIG. 10 is a sectional view illustrating an exemplary method of patterning an exemplary thin film using the exemplary imprinting device of FIG. 6.

Referring to FIG. 10, the photosensitive resin layer 520 is formed on a first surface of a base substrate 510. The imprinting device 102 is arranged above the base substrate 510 on which the photosensitive resin layer 520 is formed while spaced apart from the photosensitive resin layer 520. The first surface of the base substrate 510 may face the first surface of the first substrate 110 of the imprinting device 102.

The imprinting device 102 and the base substrate 510 are combined with each other while interposing the photosensitive resin layer 520 therebetween. The photosensitive resin layer 520 is pressed by the patterned layer 150 of the imprinting device 102, and the upper surface of the photosensitive resin layer 520 is patterned to have the concavo-convex shape according to the etch pattern 151 of the patterned layer 150. Since the patterned layer 150 of the imprinting device 102 is removed from the light blocking area SA, a step difference occurs between the transmittance area TA and the light blocking area SA. When the imprinting device 102 presses the photosensitive resin layer 520, the photosensitive resin layer 520 is pressed by the convex portion of the etch pattern 151, so that the photosensitive resin layer 520 is partially inflowed into a space defined by the removed portion of the patterned layer 150.

When the imprinting device 102 presses the photosensitive resin layer 520 and patterns the photosensitive resin layer 520, the photosensitive resin layer 520 pressed by the etch pattern 151 is partially inflowed into the space defined by the removed portion of the patterned layer 150. As a result, the photosensitive resin layer 520 pressed by the etch pattern 151 is rearranged, so that the imprinting device 102 uniformly presses the photosensitive resin layer 520 in accordance with the regions each corresponding to the transmittance area TA and the light blocking area SA, thereby uniformly patterning the photosensitive resin layer 520.

Then, the photosensitive resin layer 520 is removed from the region corresponding to where the light blocking area SA is formed through the photolithography process using the imprinting device 102 as a mask, and thus, the thin film layer 530 is formed on the base substrate 510. The thin film layer 530 is provided with the pattern of the concavo-convex shape according to the etch pattern 151 of the patterned layer 150.

As described above, since the imprinting device 102 patterns the photosensitive resin layer 520 with a uniform thickness, the photosensitive resin layer 520 is completely removed from the region corresponding to the light blocking layer 120. Thus, the imprinting device 102 may improve the uniformity of the thin film layer 530.

According to the above, the imprinting device patterns not only the region where the thin film layer is not removed but also the region where the thin film layer is removed during the patterning process. Thus, the thin film layer may be prevented from remaining in the region from which the thin film layer is removed after the etching process of the thin film layer is completed.

Also, since the photosensitive resin layer may be partially removed using the light blocking layer as the mask during the curing process of the photosensitive resin layer, the additional etching process needed to remove the photosensitive resin layer may be omitted.

Although exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. An imprinting device comprising:
    a first substrate including a transmittance area through which a light is transmitted and at least one light blocking area blocking the light;
    a light blocking layer having at least one alignment key formed by partially removing a portion therefrom and being formed on the first substrate corresponding to the at least one light blocking area, the light blocking layer disposed on the first substrate corresponding to between the transmittance area and an adjacent transmittance area; and
    a patterned layer formed on the first substrate to press an imprinting object,
    wherein the light blocking layer is disposed intermediate the patterned layer and the first substrate, and
    wherein the patterned layer comprises:
    an etch pattern formed on the first substrate corresponding to the transmittance area and the adjacent transmittance area; and
    a flow control pattern formed on the first substrate corresponding to the at least one light blocking area while covering the light blocking layer to control a flow of the imprinting object that is pressed by the patterned layer.

2. The imprinting device of claim 1, wherein the etch pattern has a concavo-convex shape.

3. The imprinting device of claim 2, wherein the flow control pattern has a same shape as that of the etch pattern.

4. The imprinting device of claim 2, wherein the flow control pattern has a convex shape, and the imprinting object pressed by the flow control pattern moves towards the etch pattern.

5. The imprinting device of claim 2, wherein the flow control pattern has a concave shape, and the imprinting object pressed by the etch pattern moves towards the flow control pattern.

6. The imprinting device of claim 1, wherein the patterned layer is a cured resin layer.

7. The imprinting device of claim 1, wherein the patterned layer covered the light blocking layer on the first substrate.

8. The imprinting device of claim 1, wherein the flow control pattern has a plurality of concave-convex portions.

9. The imprinting device of claim 8, wherein the plurality of concave-convex portions are disposed between the etch pattern and an adjacent etch pattern.

* * * * *